United States Patent [19]
Ito

[11] Patent Number: 5,537,328
[45] Date of Patent: Jul. 16, 1996

[54] METHOD FOR LAYING OUT POWER SUPPLY WIRING CONDUCTORS IN INTEGRATED CIRCUITS

[75] Inventor: Soichi Ito, Tokyo, Japan

[73] Assignee: NEC Corporation, Japan

[21] Appl. No.: 4,741

[22] Filed: Jan. 14, 1993

[30] Foreign Application Priority Data

Jan. 14, 1992 [JP] Japan .................... 4-004341

[51] Int. Cl.⁶ ................................ H01L 23/48
[52] U.S. Cl. .................. 364/489; 364/488; 257/202; 257/207
[58] Field of Search ................ 364/488, 489; 307/482.1, 491; 437/957; 257/202, 203, 207, 208, 210, 211

[56] References Cited

U.S. PATENT DOCUMENTS

| | | | |
|---|---|---|---|
| 4,511,914 | 4/1985 | Remedi et al. | 357/45 |
| 4,583,111 | 4/1986 | Early | 257/207 |
| 4,811,237 | 3/1989 | Putatunda et al. | 364/489 |
| 4,825,276 | 4/1989 | Kobayashi | 357/45 |
| 4,831,725 | 5/1989 | Dunham et al. | 364/489 |
| 4,947,229 | 8/1990 | Tanaka et al. | 257/207 |
| 4,974,049 | 11/1990 | Sueda et al. | 257/210 |
| 5,008,728 | 4/1991 | Yamamuri et al. | 357/45 |
| 5,075,573 | 12/1991 | Huignard et al. | 359/326 |
| 5,095,352 | 3/1992 | Noda et al. | 357/45 |
| 5,155,390 | 10/1992 | Hickman et al. | 307/465.1 |
| 5,164,811 | 11/1992 | Tamura | 257/207 |
| 5,283,753 | 2/1994 | Schucker et al. | 364/489 |
| 5,315,182 | 5/1994 | Sakashita et al. | 307/482.1 |
| 5,343,058 | 8/1994 | Shiffer | 257/204 |
| 5,349,542 | 9/1994 | Brasen et al. | 364/578 |

OTHER PUBLICATIONS

Xiong and Kuh, "The Scan Line Approach to Power and Ground Routing", IEEE, 1986, pp.6–9.

Haruyama and Fussell, "A New Area–Efficient Power Routing Algorithm for VLSI Layout", IEEE, 1987, pp. 38–41.

Rothermel and Mlynski, "Computation of Power Supply Nets in VLSI Layout", IEEE 18th Design Automation Conf., 1981, pp. 37–42.

Syed and Gamal, "Single Layer Routing of Power/Ground Networks in ICs", Jour. of Digital Sys. Vol. VI, No. 1, 1982, pp. 53–63.

Chowdhury and Breur, "Minimal Area Design of Power/Ground Nets Having Graph Topologies", IEEE Trans Circuits & Systems, Vol. 34, No. 12, Dec. 1987, pp. 1441–1451.

Dutta and Marek–Sadowska, "Automatic Sizing of Power/Ground (P/G) Networks in VLSI", 26th ACM/IEEE Design Automation Conf, 1989, pp. 783–786.

Song and Glasser, "Power Distribution Techniques for VLSI Circuits", IEEE Journal of Solid State Circuits, vol. 21, No. 1, pp. 150–156.

*Primary Examiner*—Kevin Teska
*Assistant Examiner*—Tyrone V. Walker
*Attorney, Agent, or Firm*—Whitham, Curtis, Whitham & McGinn

[57] ABSTRACT

For laying out power supply wiring conductors in integrated circuits, a plurality of function blocks are located, and laid-out positions of power supply wiring conductors of first and second levels are determined on the basis of the located function blocks. Power supply wiring conductors are temporarily laid out by using power supply wiring conductors of third and fourth levels, so as to connect the temporarily laid third and fourth level power supply wiring conductors to the power supply wiring conductors of the first and second levels, so that a power supply network composed of all the power supply wiring conductors is constructed in a desired chip area. Then, a circuit current in the power supply network is calculated, and the current flowing through each power supply wiring conductor is adjusted by conductor width adjustment, deletion or addition of at least one third and/or fourth level power supply wiring conductor, or change of position of an interlayer connection hole between the power supply wiring conductor of the second level and the third and/or fourth level power supply wiring conductor. Thus, optimum power supply wiring conduct layout can be realized without moving the power supply wiring conductors of the first and second levels and therefore without moving the location of the function blocks.

9 Claims, 9 Drawing Sheets

5,537,328

METHOD FOR LAYING OUT POWER SUPPLY WIRING CONDUCTORS IN INTEGRATED CIRCUITS

BACKGROUND OF THE INVENTION

1. Field of the Invention

The present invention relates to a method for laying out power supply wiring conductors in integrated circuits, and more specifically to a method for laying power supply wiring conductors so as to obtain a desired LSI functions by means of automatic laying and wirings of function blocks.

2. Description of Related Art

In the prior art, in order to realize desired LSI functions such as gate arrays, standard cells, and the like on a silicon substrate, automatic locating and wirings of function blocks have been known. However, the wirings of power supply wiring conductors have not so been automatized as in a signal line automatic treatment (which includes the locating of function blocks and interconnections of signal lines between terminals of the laid-out function blocks), for example, the gate array is excluded from the subject of the automatic wiring, and it has been handled as a wired block in which wiring conductors have been previously prepared and wired before the function block is located. In addition, some of the standard cells have been made to have such a structure that if function cells are arranged in the form of a linear array, power supply conductors are interconnected as a matter of course, and the function cells are connected at one end or at opposite ends of the linear array to power supply lines or pads.

However, with recent advances having realized an increased integration density and an increased operation speed due to microminiaturization of devices, distribution of consumed electric power on a chip surface has changed so that a diagram of the distribution extends toward a large consumed electric power side. As a result, in the method for laying out the previously prepared wiring conductors independently of the consumed electric power distribution in the inside of the chip, or in the method of simply connecting the wiring conductors of the same conductor width, an actual current sometimes exceed a bearable current capacity of the wiring conductor. This results in lowered reliability, particularly from the viewpoint of electromigration, and therefore, is very undesirable. In this connection, it may be considered to widen the power supply wiring conductors so that the maximum level of the consumed electric power distribution can be satisfied anywhere within the chip. However, this results in that, in a region of a small consumed electric power, the power supply wiring conductors have an excessive conductor width, which will remarkably decrease an area utility efficiency.

Therefore, a method for adjusting the width of the power supply wiring conductors is desired. However, it can be generally said that, in order to lay the power supply wiring conductors, it is required to ensure necessary space. For this purpose, when the functions blocks are automatically located and wired, routes and spaces for laying the power supply wiring conductors must be simultaneously taken into consideration.

However, conventional automatic locating and wiring tools have no function capable of satisfying the above mentioned demand. Besides, the conventional automatic locating and wiring tools still have many remaining problems in connection with only effective execution of automatic connection of signal lines.

Accordingly, from the viewpoint of software development, a further lead is imposed to add, to the existing functions of the automatic locating and wiring tools, a procedure which effectively performs various processings to decide location of function block, to calculate distribution of a consumed electric power, to decide laying routes and widths of power supply wiring conductors, to modify the previously decided location of function blocks so as to ensure a space for laying the power supply wiring conductors, to calculate distribution of a consumed electric power, again, and to adjust the widths of power supply wiring conductors. In addition, this may obstruct the improvement of various problems in connection with the conventional automatic connection of signal lines, and rather, may sacrifice automatic locating and wiring means which have been considered to be good in the prior art.

SUMMARY OF THE INVENTION

Accordingly, it is an object of the present invention to provide a method for laying out power supply wiring conductors in integrated circuits, which has overcome the above mentioned defect of the conventional one.

Another object of the present invention is to provide a method for laying out power supply wiring conductors In integrated circuits, so as to control a load or current value burdened on power supply wiring conductors of first and second levels in accordance with distribution of consumed electric power by utilizing power supply wiring conductors of third and succeeding upper levels, thereby allowing location of function blocks and interconnection of signal lines of the function blocks to be performed in accordance with the prior art.

The above and other objects of the present invention are achieved in accordance with the present invention by a method for laying out power supply wiring conductors in integrated circuits, the method including a first step of locating a plurality of function blocks and determining laid-out positions of power supply wiring conductors of a first level or first and second levels on the basis of the located function blocks; a second step of temporarily laying power supply wiring conductors by using power supply wiring conductors of at least one level of upper levels including a third level, and connecting the temporarily laid-out power supply wiring conductors to the power supply wiring conductors of the first level or the first and second levels, thereby constructing a power supply network composed of all the power supply wiring conductors in a desired chip area; and a third step of calculating a circuit current in the power supply network and adjusting the current flowing through each power supply wiring conductor by conductor width adjustment, deletion or addition of at least one power supply wiring conductor of one level of the upper levels including the third level, or change of position of an interlayer connection hole between the power supply wiring conductor of the second level and the power supply wiring conductor of one level of the upper levels.

The above and other objects, features and advantages of the present invention will be apparent from the following description of preferred embodiments of the invention with reference to the accompanying drawings.

DESCRIPTION OF THE PREFERRED EMBODIMENTS

Figure 1:
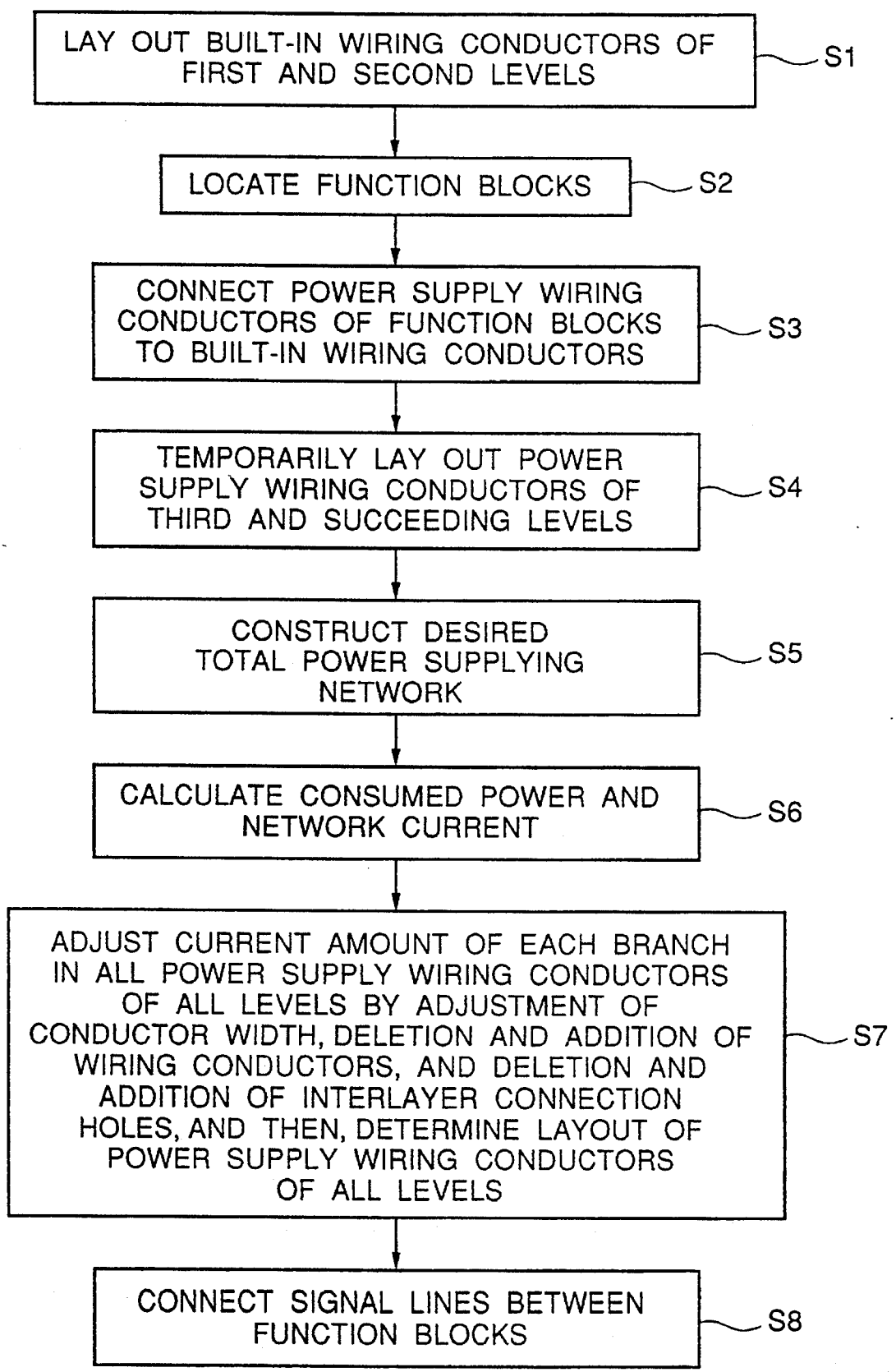
FIG. 1 is a flow chart illustrating various steps of one embodiment of the method in accordance with the present invention for laying out power supply wiring conductors in integrated circuits.

Referring to FIG. 1, there is shown a flow chart illustrating various steps of one embodiment of the method in accordance with the present invention for laying out power supply wiring conductors in integrated circuits. FIGS. 2A to 6 are layout patterns illustrating the power supply wiring conductors obtained after the respective steps of the process shown in FIG. 1 are performed.

Figure 2A:
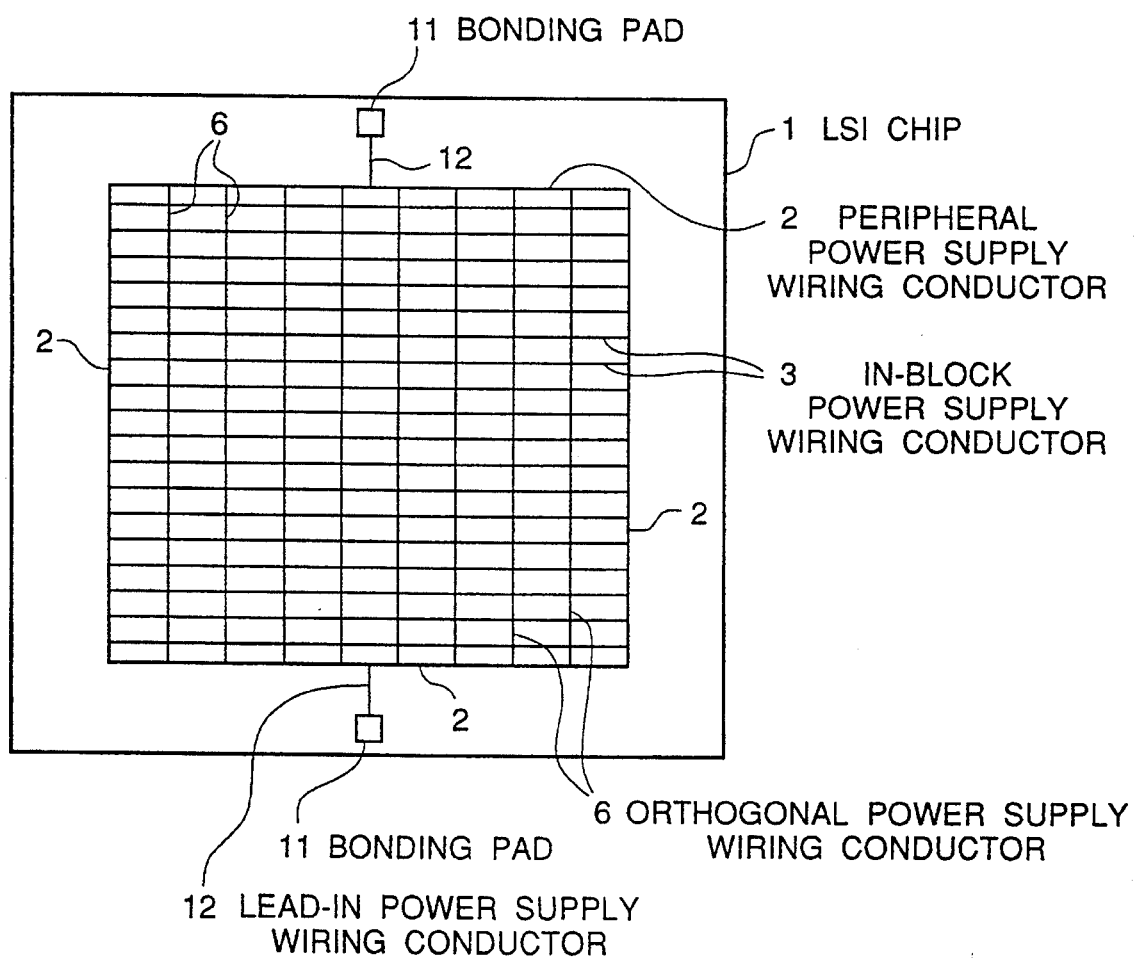
FIGS. 2A and 2B are layout patterns of the power supply wiring conductors treated in the steps S1 to S3 of the process shown in FIG. 1.

The step S1 in the flowchart shown in FIG. 1 is the step of previously laying out power supply wiring conductors of first and second levels on the precondition that a plurality of function blocks are located in accordance with a conventional rule. For example, the layout pattern of the power supply wiring conductors obtained after the step S1 is performed, corresponds to built in fixed wiring conductors of a gate array as shown in FIG. 2A. In FIG. 2A, only a peripheral power supply wiring conductor 2 surrounding an internal region of an LSI chip, 1, power supply wiring conductors 3 for function blocks in the form of polycells, power supply wiring conductors 6 orthogonal to the power supply wiring conductors 3, lead-in power supply wiring conductors 12 extending from bonding pads 11, are shown for simplification of drawing. Therefore, the fixed wiring conductors can include the peripheral power supply wiring conductor 2, the in-block power supply wiring conductors 3, the power supply wiring conductors 6 and the lead-in power supply wiring conductors 12.

In the succeeding step S2, a plurality of function blocks are located. Ones of the function blocks are located along the fixed wiring conductors. But, others of the function blocks are large, a so-called "macroblock", and have a peripheral power supply wiring conductor, as designated by Reference Numerals 4 and 5 in FIG. 2B. Therefore, the macroblock is located so as to omit a portion of the fixed wiring conductors. Thus, macroblock peripheral power supply wiring conductors 4 and 5 are added as shown in FIG. 2B.

Figure 2B:
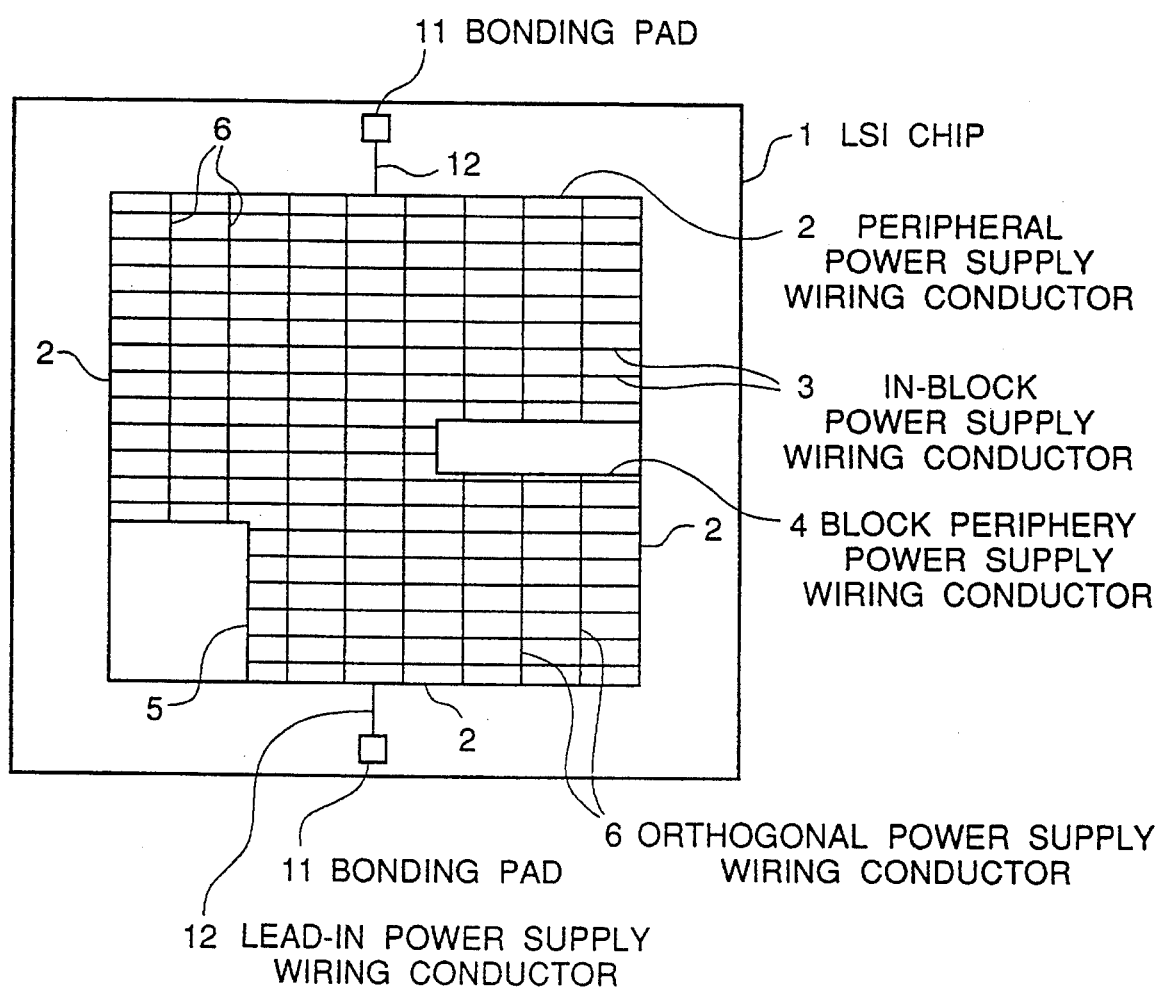

In FIGS. 2A and 2B, X direction wiring conductors are wired at the first level and Y direction wiring conductors are wired at the second level above the first level. In addition, the power supply wiring conductors 12 and the bonding pads 11 arc not necessarily required to be formed either at the first level or at the second level.

In the step S3, the power supply wiring conductors of the function blocks are connected to the built-in wiring conductors of the first and/or second level.

Figure 3:
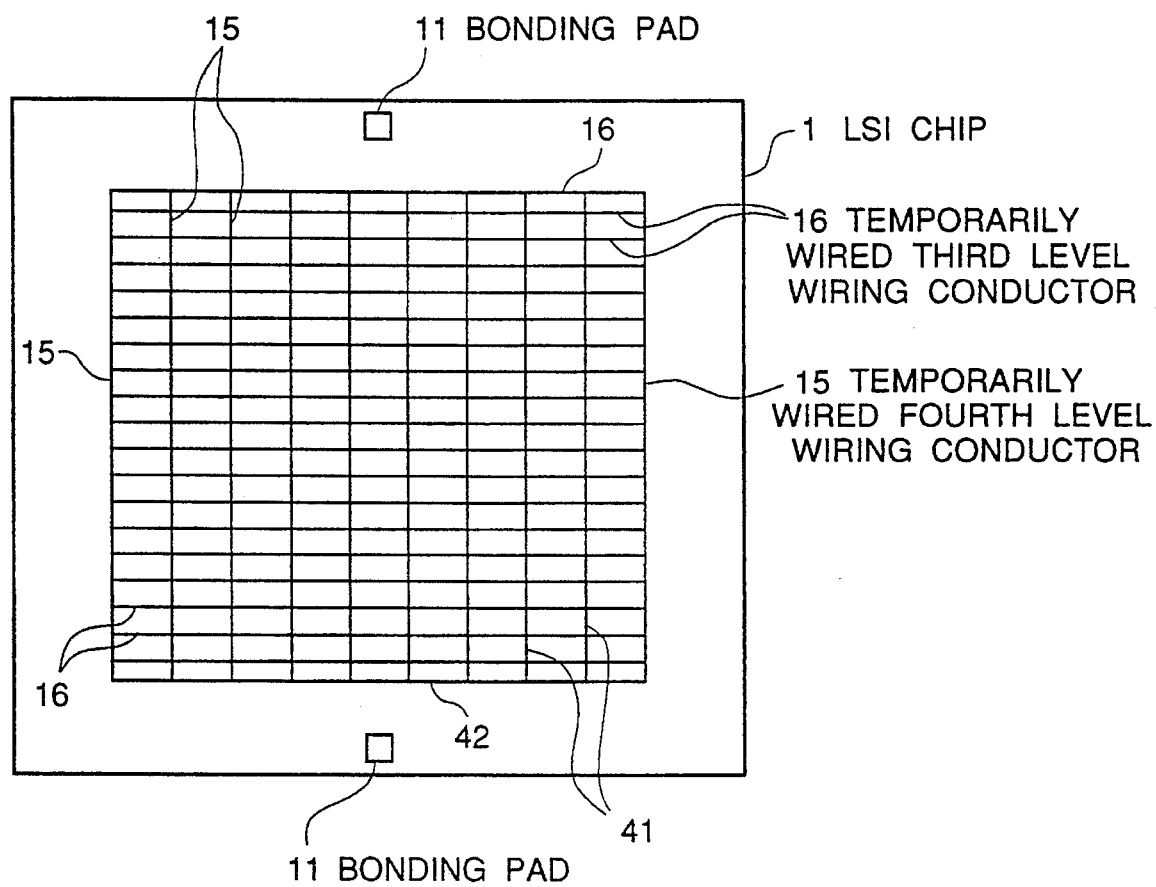
FIG. 3 is a layout pattern of the power supply wiring conductors treated in the step S4 of the process shown in FIG. 1.

In the step S4, wiring routes for power supply wiring conductors of upper levels including a third level above the second level are temporarily determined. FIG. 3 shows a condition in which a temporary wiring is performed by using third level wiring conductors 16 and fourth level wiring conductors 15.

In the shown embodiment, the third level wiring conductors 16 and the fourth level wiring conductors 15 are wired at the same positions as those of the first level X-direction wiring conductors 2 and 3 and the second level Y-direction wiring conductors 2 and 6 shown in FIG. 2A. In addition, although not shown in the drawings, connection holes are formed at intersections between the third level wiring conductors 16 and the fourth level wiring conductors 15. Further, connection holes are formed at intersections between the second level wiring conductors (Y direction) shown in FIG. 2B and the third level wiring conductors (X direction) shown in FIG. 3.

Thus, in the succeeding step 85, a power supply network is formed of the wiring conductors of all four levels.

In the layout diagrams shown in FIGS. 2 and 3 and succeeding figures, all of the shown power supply wiring conductors show either ground lines (OND) or high voltage power supply lines ($V_{DD}$). In fact, however, both of the ground lines (OND) and the high voltage power supply lines ($V_{DD}$) are wired or laid out in accordance with the present invention.

Figure 4:
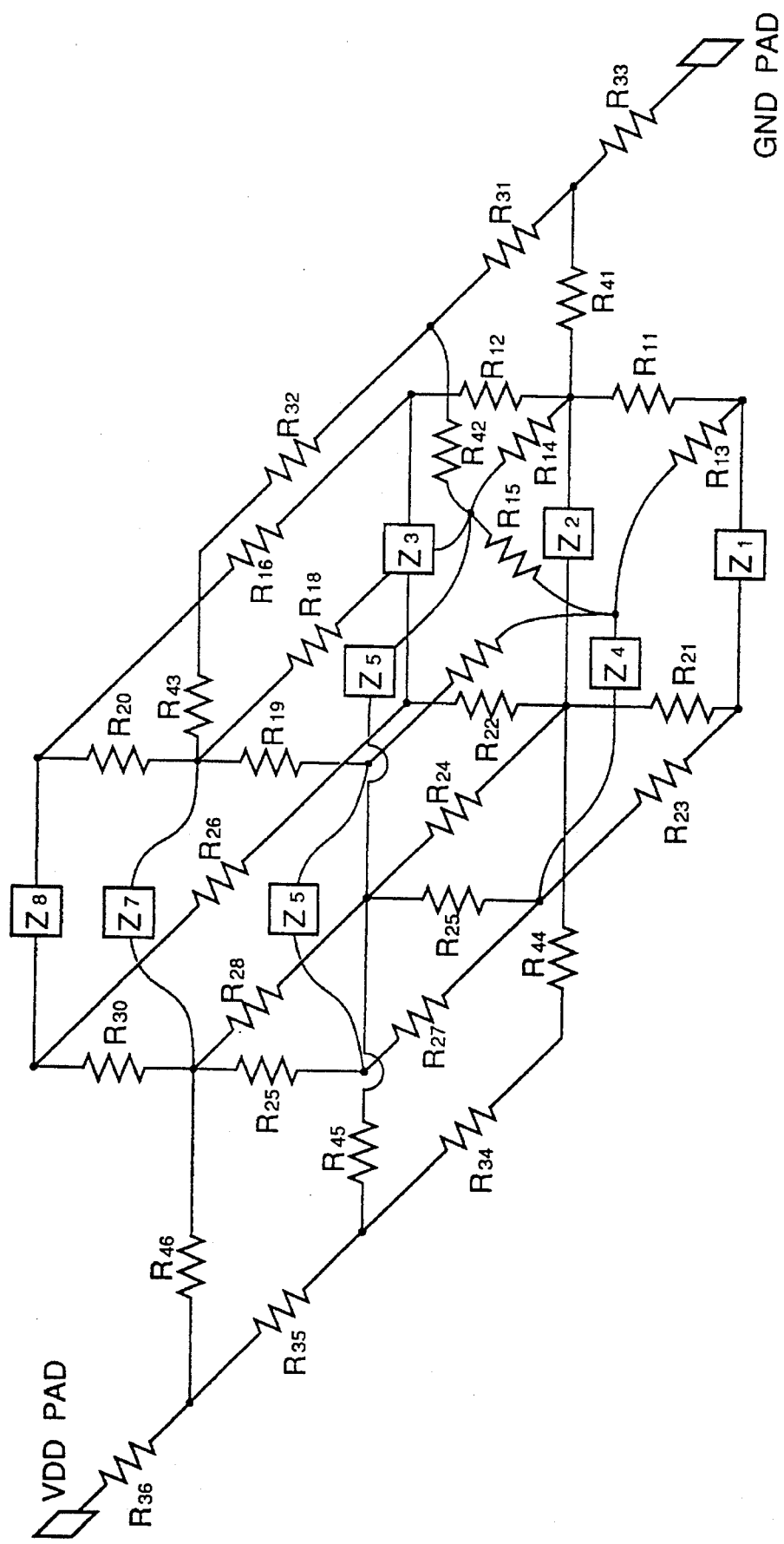
FIG. 4 is a circuit diagram of the network realized in the step S5 of the process shown in FIG. 1.

The power supply network in this condition is constructed as shown in FIG. 4 for example. However, if a network realized by the wiring conductors shown in FIGS. 2A, 2B and 3 are shown, the network becomes too complicated. Therefore, FIG. 4 shows an extremely simplified network having only two levels of wiring conductors, and therefore, does not correspond to the network realized by the wiring conductors shown in FIGS. 2A, 2B and 3. In FIG. 4, Z1 to Z8 show a circuit impedance of the functions blocks in the case of a CMO8 circuit, respectively. R11 to R20 designate a resistance of each branch of the first level ground wiring conductors, and R21 to R30 represent a resistance of each branch of the second level voltage ($V_{DD}$) supply wiring conductors. R31 to R33 indicate a resistance of each branch of the second level ground wiring conductors, and R34 to R36 show a resistance of each branch of the second level voltage ($V_{DD}$) supply wiring conductors. R41 to R46 designate a resistance of each of through hole connections between the first level voltage supply wiring conductors and the second level voltage supply wiring conductors. Incidentally, the curved lines in FIG. 4 are so made to make the circuit diagram more readable.

As mentioned above, in FIG. 4, Z1 to Z8 can be considered to correspond to the functions blocks in the case of a CMOS circuit. Therefore, if a consumed electric power of each function block at a desired frequency is sought in a test vector for consumed power calculation, each of Z1 to Z8 can be replaced by constant current sources having a current value corresponding to the consumed electric power.

Thus, in the Step S6, there is calculated the current value of each wiring conductor or branch in the power supply network as shown in FIG. 4 in an extremely simplified form.

Thereafter, the current value of each branch of the wiring conductors are examined or checked from the viewpoint of electromigration. If a wiring conductor which is not considered to have a sufficient conductor width from the viewpoint of electromigration is found, adjustment of the conductor width of the third and/or fourth level wiring conductors, change of the connection hole(s) between the second and third level wiring conductors, addition or change of connection hole(s) between the second and third level wiring conductors, and addition of third and/or fourth level wiring conductor(s) to the temporarily laid-out third and fourth level wiring conductors are performed so as to modify the current distribution without modifying the first and second level wiring conductors. Thus, the respective current values of all branches of the first and second level wiring conductors are controlled to be not greater than a predetermined current value without changing the previously fixed conductor width of the first and second level wiring conductors.

In the above mentioned embodiment, the most significant point is that it is unnecessary to increase the conductor width of the first and second level wiring conductors, nor is it necessary to change the respective positions of the function blocks which are realized by using only the first level wiring conductor or both of the first and second level wiring conductors and which had been located in the step S2. Therefore, it is no longer necessary to relocate the function blocks in accordance with the change of the wiring conductor widths and to calculate the current distribution again so as to check whether or not the current exceeds the limit value, which had been required in the prior an. Accordingly, the design or layout can be effectively performed.

On the other hand, in a region having a large margin or allowance in the current value, it is possible to partially omit the third and fourth level wiring conductors so that an extended space for wiring the signal conductors can be obtained.

In the above mentioned embodiment, the conductor width has been examined from the viewpoint of electromigration. However, in the case that a power supply voltage drop caused by wiring resistances has to be maintained to be not greater than a predetermined value, the third and fourth level wiring conductors can be adjusted in a similar procedure.

In the above mentioned process, the current values have been calculated by maintaining the temporarily laid-out third and fourth level wiring conductors as they are. However, in order to improve efficiency, it is possible to calculate the consumed electric power for each of the function blocks in accordance with the method mentioned hereinbefore, to prepare a distribution diagram of electric power, to perform addition, omission and width change of the third and fourth level wiring conductors before the detailed current value is calculated for each branch, and thereafter, to calculate the detailed current value for each branch.

Figure 5A:
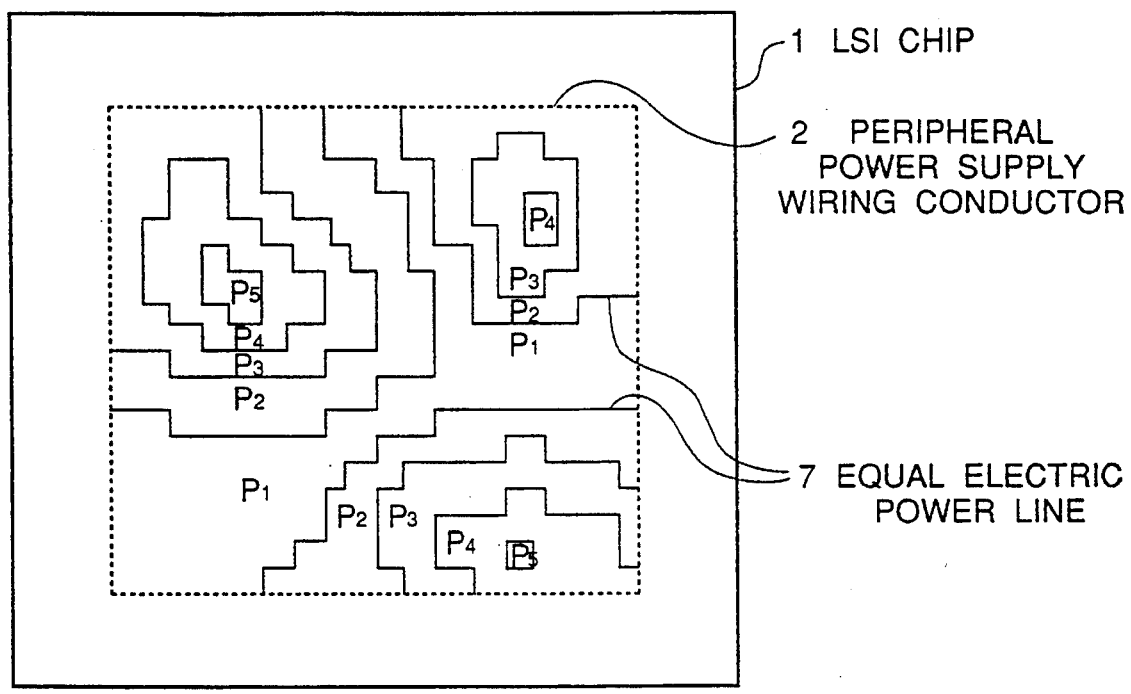
FIGS. 5A and 5B are layout diagrams of the equal electric powers calculated in the step S6 of the process shown in FIG. 1.
Figure 5B:
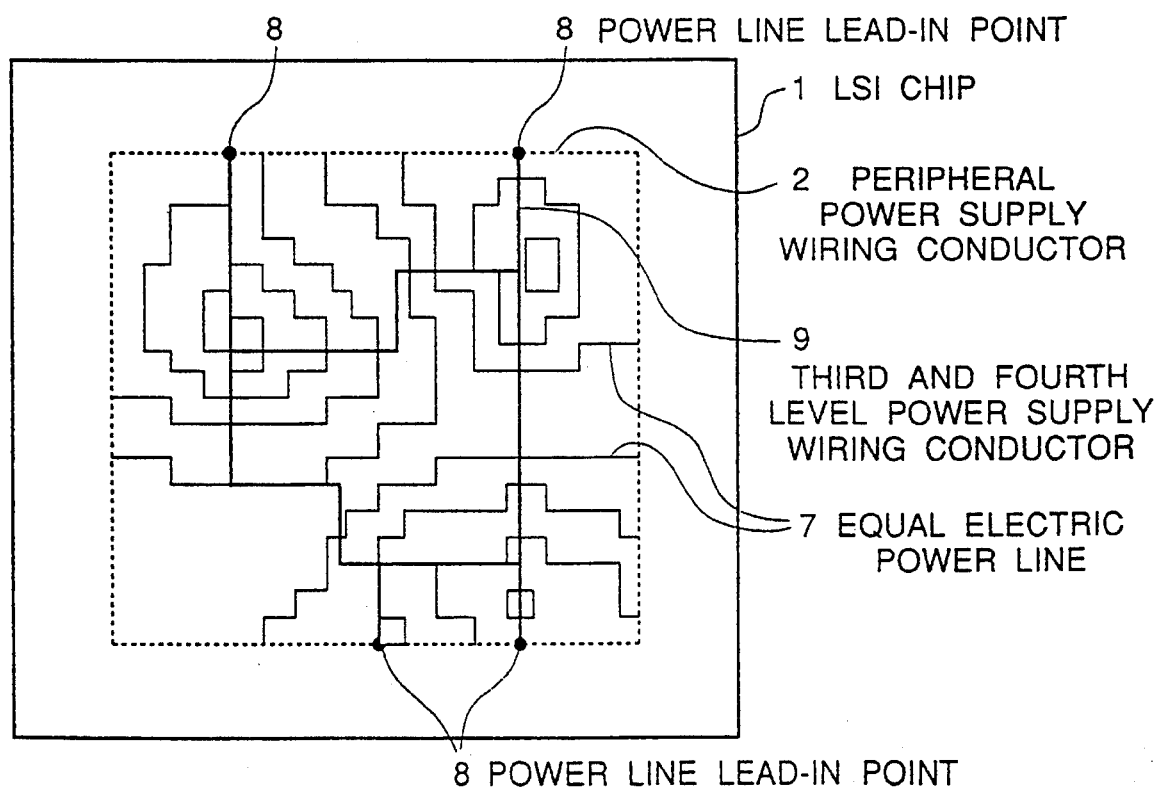

Referring to FIG. 5A, there is shown an example of the distribution diagram of electric power obtained in accordance with the modified process mentioned just above. In FIG. 5A, equal electric power lines 5 for each function block are shown. P5 shows a maximum consumed power level, and P1 indicates a minimum consumed power level. FIG. 5B shows a wiring diagram of the third and fourth power supply level wiring conductors after the addition and omission have been performed in accordance with the distribution diagram of electric power shown in FIG. 5A. Reference Numeral 9 designates power supply wiring conductors shifted or moved in accordance with the modified process mentioned above, and Reference Numeral 8 shows power lead-in points for the power supply wiring conductors.

Figure 6:
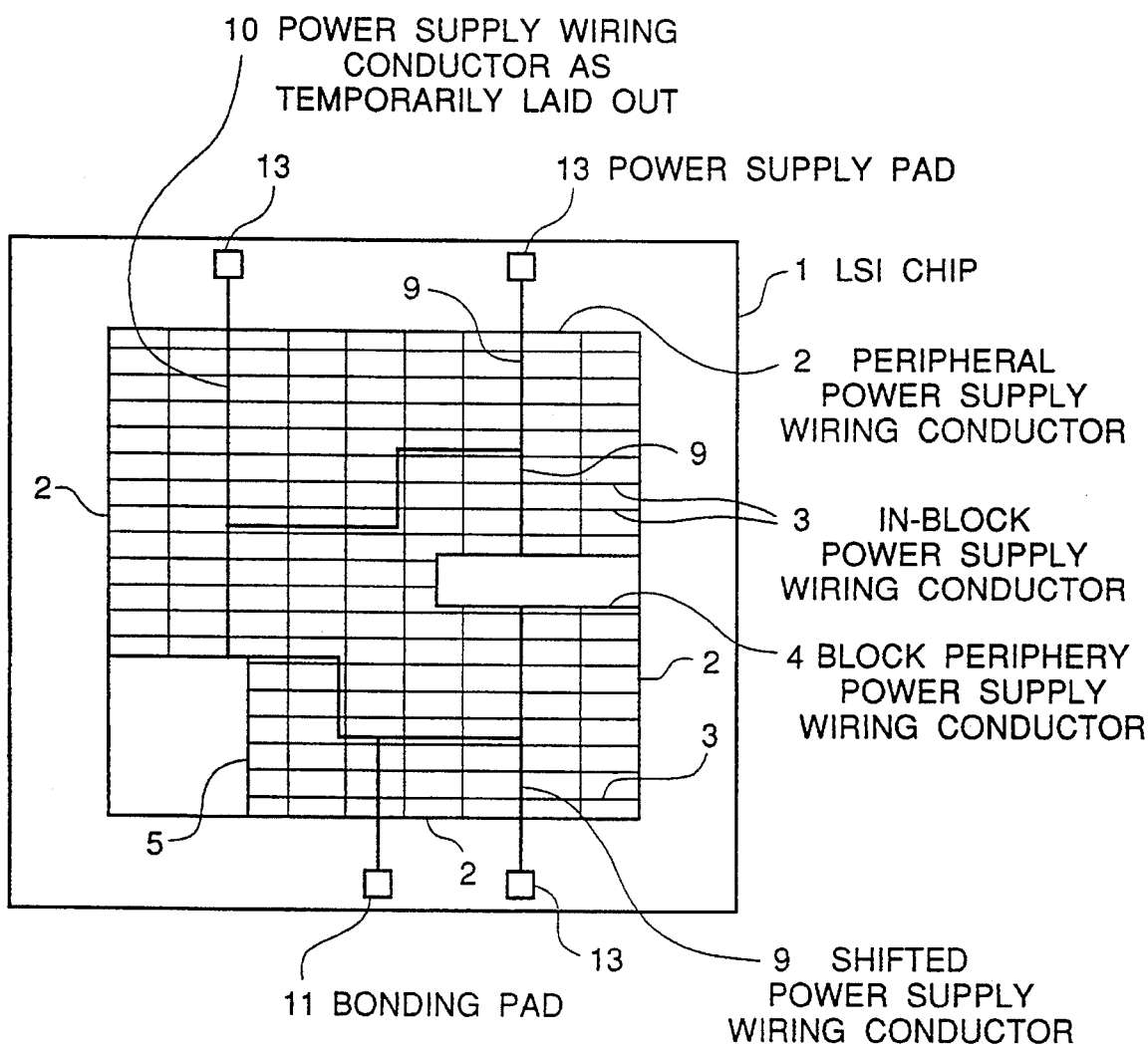
FIG. 6 is a layout pattern of the power supply wiring conductors finally obtained in the process shown in FIG. 1.

Referring to FIG. 6, there is shown a finally obtained layout of all power supply wiring conductors of the fast to fourth levels, assuming that no adjustment is required for obtaining FIG. 6 from FIG. 5B. Of the third and fourth level power supply wiring conductors temporarily laid out in the step S4, only the power supply wiring conductor 10 is maintained as it is. The other power supply wiring conductors are substantially shifted or moved as the result of the addition and/or deletion of the third and/or fourth level wiring conductors, and are given as Reference Numeral 9 in FIG. 6. In addition, one power supply pad shown at an upper position in FIG. 2A is removed, and three new power supply pads 13 (two of which are shown at an upper position in FIG. 6 and the remaining one is shown at a lower position) am added.

Figure 7:
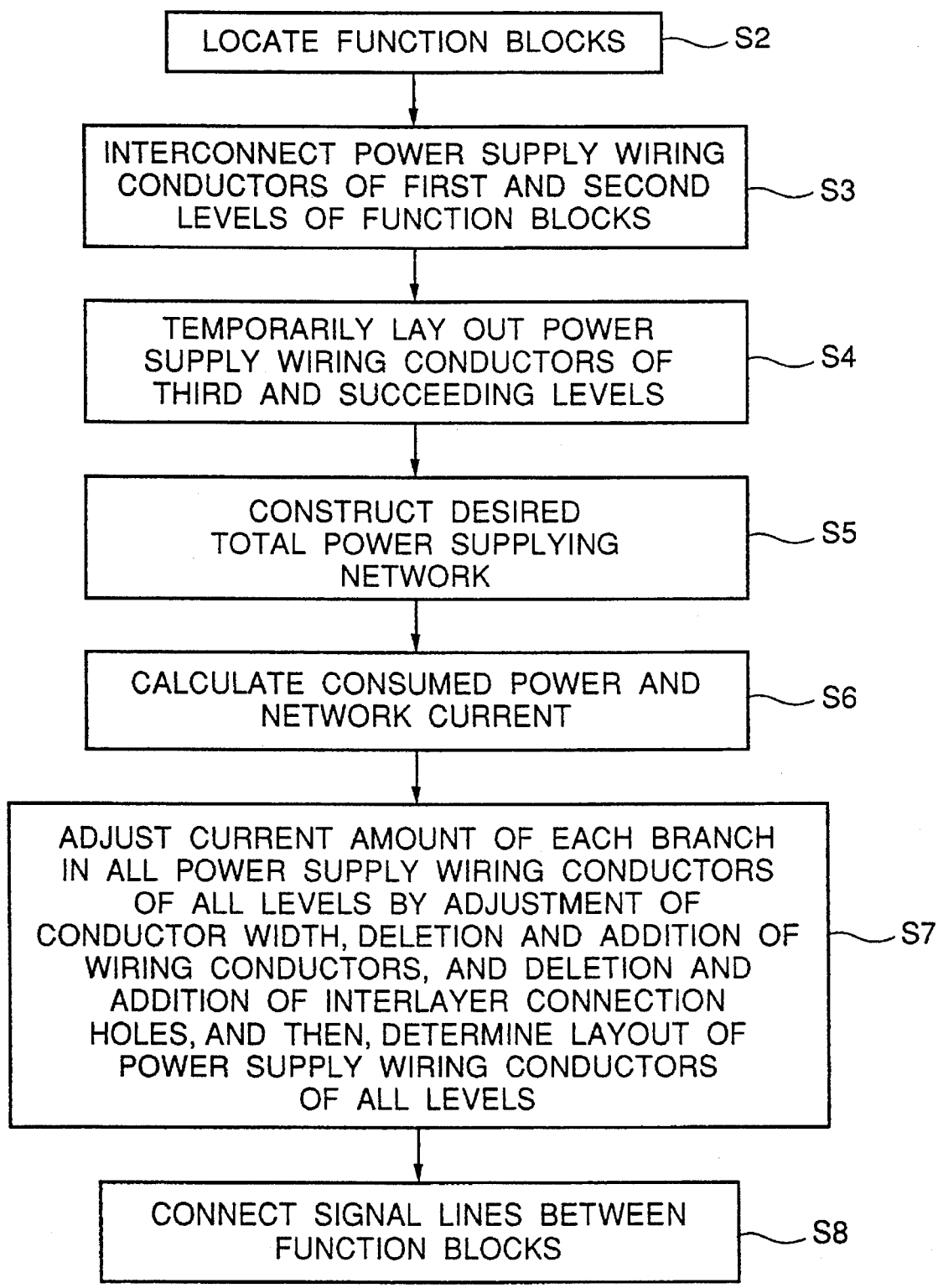
FIG. 7 is a flow chart illustrating various steps of another embodiment of the method in accordance with the present invention for laying out power supply wiring conductors in integrated circuits.

Referring to FIG. 7, there is shown a flow chart illustrating various steps Of another embodiment of the method in accordance with the present invention for laying out power supply wiring conductors in integrated circuits. This second embodiment is different from the first embodiment in that the step S1 is omitted. Therefore, the function blocks are located in the Step S2, and thereafter, wired or laid-out locations of the first and second level power supply wiring conductors are determined.

Figure 8:
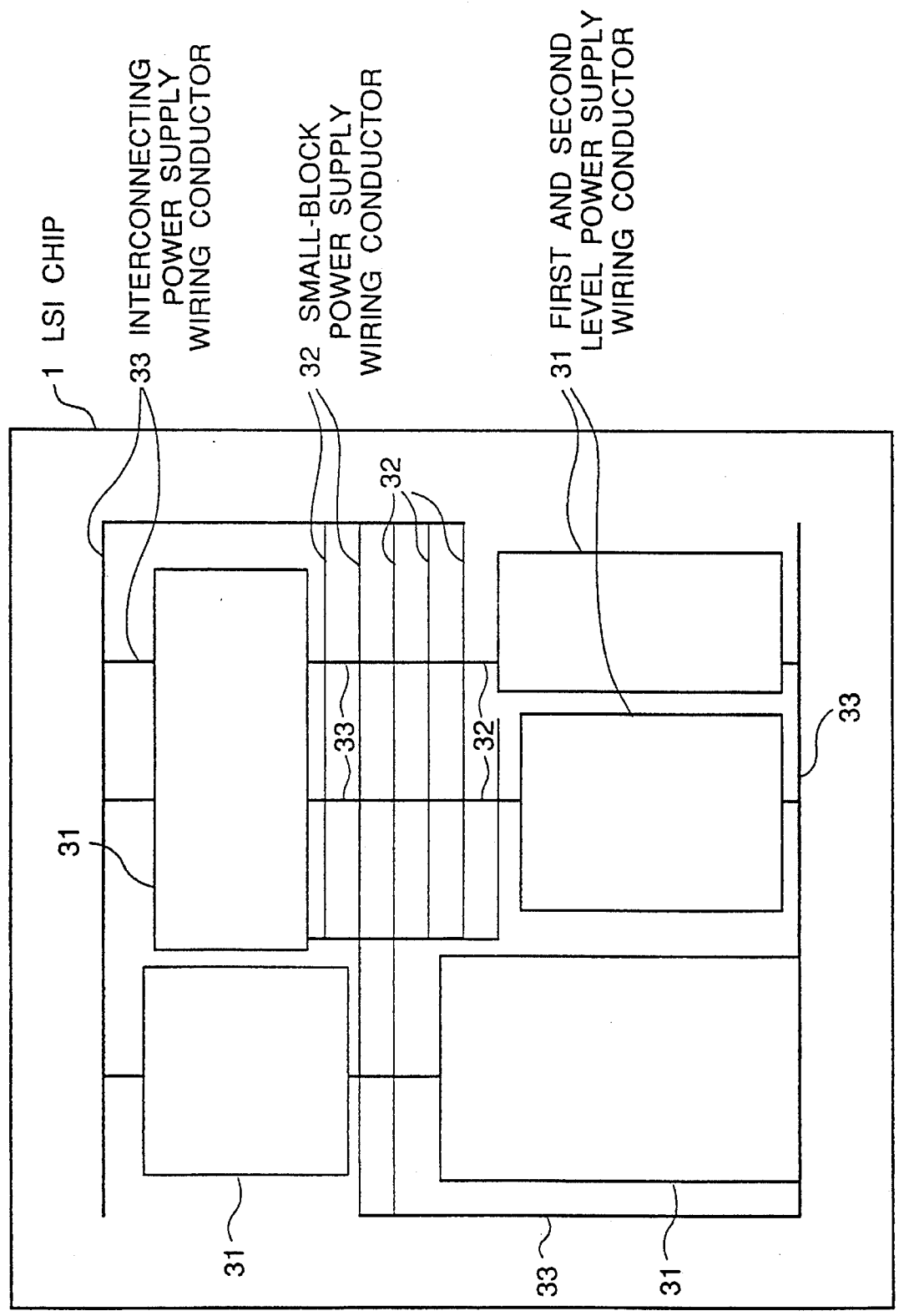
FIG. 8 is a layout pattern of the power supply wiring conductors after the first two steps of the process shown in FIG. 7 are completed.

As a result, the layout of power supply wiring conductors as shown in FIG. 8 is obtained. In FIG. 8, all X-direction wiring conductors are positioned at the first level, and all Y-direction wiring conductors are positioned at the second level. The shown power supply wiring conductors include periphery power supply wiring conductors 31, small function block power supply wiring conductors 32 and power supply wiring conductors 33 for interconnecting the power supply wiring conductors 31 and 32. All of the power supply wiring conductors 31, 32 and 33 are positioned at the first and second levels. The succeeding processes are the same as those of the first embodiment, and therefore, explanation will be omitted.

In the two embodiments as mentioned above, after the wiring or layout and adjustment of the power supply wiring conductors have been completed, interconnection of signal terminals of the functions block is performed by using wiring conductors of desired levels, ordinarily all wiring levels.

As explained above, the method in accordance with the present invention for laying out power supply wiring conductors in integrated circuits, is characterized in that the current values of power supply wiring conductors within the chip is adjusted by using power supply wiring conductors of third and succeeding upper levels. Therefore, it is not necessary to change the positions of the first and second level power supply wiring conductors and the function blocks which have been determined before the control of the current value distribution. Accordingly, the consumed electric power distribution within the chip is not changed by optimization of the layout or wiring of the power supply wiring conductors. In addition, the current calculation of the power supply network can be easily performed, and the chip design or layout can be effectively performed.

The invention has thus been shown and described with reference to the specific embodiments. However, it should be noted that the present invention is in no way limited to the details of the illustrated structures but changes and modifications may be made within the scope of the appended claims.

I claim:

1. A method for laying out power supply wiring conductors in integrated circuits, the method including:

a first step of locating a plurality of function blocks and determining laid-out positions of power supply wiring conductors of a first level or first and second levels on the basis of the located function blocks;

a second step of temporarily laying power supply wiring conductors by using power supply wiring conductors of at least one level of upper levels including a third level, and connecting said temporarily laid-out power supply wiring conductors to said power supply wiring conductors of the first level or the first and second levels, thereby constructing a power supply network comprising all the power supply wiring conductors in a desired chip area; and a third step of calculating a circuit current in said power supply network and adjusting the current flowing through each power supply wiring conductor by conductor width adjustment, deletion or addition of at least one power supply wiring conductor of one level of said upper levels including the third level, or change of position of an interlayer connection hole between the power supply wiring conductor of the second level and the power supply wiring conductor of one level of said upper levels.

2. A method claimed in claim 1 wherein said power supply wiring conductors of the first level or the first and second levels comprise fixed wiring conductors which are previously built-in for enabling location of function blocks.

3. A method claimed in claim 1 wherein said power supply wiring conductors of the first level or the first and second levels include wiring conductors for interconnecting between wiring conductors previously fixed for enabling location of function blocks, and wiring conductors of another function block.

4. A method for laying out power supply wiring conductors for an integrated circuit, comprising the steps of:

laying out a first level of wiring conductors extending in a first direction;

laying out a second level of wiring conductors extending in a second direction crossing over said first level;

locating function blocks for an integrated circuit along said first level and said second level of wiring conductors;

connecting power supply branches from said first level and said second level to said function blocks;

temporarily laying at least a third level of wiring conductors;

evaluating current demands on each of said power supply branches against a predetermined current threshold;

connecting ones of said wiring conductors from said at least third level to function blocks connected to ones of said branches exceeding said predetermined current threshold; and deleting ones of said wiring conductors from said at least third level which are not connected to said function blocks.

5. A method for laying out power supply wiring conductors in an integrated circuit as recited in claim 4, further comprising the steps of:

laying at least a fourth level of wiring conductors crossing said third level; and connecting ones of said wiring conductors from said fourth level to function blocks connected to ones of said branches exceeding said predetermined threshold.

6. A method for laying out power supply wiring conductors in an integrated circuit as recited in claim 4 wherein said first level extends in an x-direction and said second level extends in a y-direction to form a grid, said x-direction being orthogonal to said y-direction.

7. A method for laying out power supply wiring conductors in an integrated circuit as recited in claim 5 wherein said first level and said third level extends in an x-direction and said second level and said fourth level extends in a y-direction to form a grid, said x-direction being orthogonal to said y-direction.

8. A method for laying out power supply wiring conductors in an integrated circuit as recited in claim 4 further comprising the step of adjusting a width of said third level wiring conductors according to a current demand.

9. A method for laying out power supply wiring conductors in an integrated circuit as recited in claim 5 further comprising the step of adjusting a width of said fourth level wiring conductors according to current demand.

* * * * *